United States Patent [19]

Heath et al.

[11] Patent Number: 4,517,464

[45] Date of Patent: May 14, 1985

[54] SENSOR SYSTEM

[75] Inventors: James E. Heath; Hilmer W. Swenson, both of Albuquerque, N. Mex.

[73] Assignee: The United States of America as represented by the Secretary of the Air Force, Washington, D.C.

[21] Appl. No.: 431,866

[22] Filed: Sep. 30, 1982

[51] Int. Cl.³ .......................... G01T 1/24; H01L 27/14
[52] U.S. Cl. .................................. 250/370; 250/578; 357/30; 357/45; 357/61
[58] Field of Search ............... 250/370 R, 370 F, 578; 357/32, 56, 30, 61, 30 A-30 R, 45, 29

[56] References Cited

U.S. PATENT DOCUMENTS 4,063,095  12/1977  Wieder ................................. 250/338
4,217,490  8/1980  Fiorito et al. ....................... 250/211

OTHER PUBLICATIONS

"Mechanisms of Radiation Effects in Electronic Material", vol. 1, by V. A. J. van Lint et al., 1980, pp. 1-13, and 335, 347-355.

"High-Performance Backside-Illuminated $Hg_{0.78}Cd_{0.22}Te/Cd\,Te$ ($\lambda_{co}=10$ μm) Planar Diodes", M. Chu et al., Sep. 1980, pp. 486-488.

Primary Examiner—James W. Davie
Assistant Examiner—Georgia Epps
Attorney, Agent, or Firm—Donald J. Singer; Bernard E. Franz

[57] ABSTRACT

An infrared sensor system for use on satellites comprising dual arrays of mercury cadmium telluride semiconductor elements. One array of conventional photovoltaic detectors is wired in parallel with a novel array of HdCdTe material in which the n-type region of each mesa and the resulting p-n junction is considerably smaller than that utilized in the conventional detector. As the cumulative dose of incident radiation is increased, type conversion in both arrays occurs resulting in degraded performance in the conventional array but an increase in performance caused by the now effective p-n junction area in the novel array. An electronic switching device, coupled with a dosimeter, alternately selects the conventional array or the novel array depending upon the total dose of radiation received.

8 Claims, 4 Drawing Figures

SENSOR SYSTEM

RIGHTS OF THE GOVERNMENT

The invention described herein may be manufactured and used by or for the Government of the United States for all governmental purposes without the payment of any royalty.

BACKGROUND OF THE INVENTION

The present invention relates to photovoltaic infrared sensor systems in general, and in particular to such sensor systems employing mercury cadmium telluride semiconductor devices.

Mercury cadmium telluride is an intrinsic photodetector material used in sensor systems on military satellites employed for detection, designation, and discrimination of various targets via their infrared signatures. Such satellite electronic equipment must operate in an environment of natural space radiation and may also have a requirement to survive and perform after exposure to an atmospheric nuclear detonation. Effects of such detonations on spacebased electronic equipment include reduced long-term life due to absorption of high doses of ionizing radiation, noise in optical sensors, and changed component operating characteristics.

With respect to the mercury cadmium telluride semiconductor devices, the radiation causes type conversion on the surface of the tri-metal homojunction infrared sensors creating cross talk between adjacent same type doping regions. With cumulative radiation, the semiconductor device degrades in performance until it no longer functions, thereby rendering the sensor system ineffective in performing its mission.

Prior work in this area includes U.S. Pat. No. 4,063,095 which discloses dual sensing arrays with the second array shielded from radiation and used as a standard to compare against the output of the array that is irradiated. The second array never replaces the first array. Also, U.S. Pat. No. 4,217,490 discloses the use of three HgCdTe elements for use in an infrared detector, with each of the elements used for detecting a different band of the infrared spectrum. While each of these patents is suitable for its intended purpose, neither patent solves the problem of extending the useful life of the sensor system in a radiation environment.

SUMMARY OF THE INVENTION

It is therefore an object of the invention to form a mercury cadmium telluride semiconductor device which is fully effective as an infrared detector and which will function in a radiation environment for a significantly longer period of time than present detectors.

According to the invention, a conventional array of HgCdTe photovoltaic detectors is utilized in parallel with a novel array of HgCdTe photovoltaic detectors in which there is a much smaller p-n junction area for each detector such that the radiation environment increases the effective area of each detector junction in the array to approximate the initial junction area of the first array. It is at this point that the second array is capable of functioning since its effective junction areas have been increased by radiation while the junction area of the first array has been degraded by radiation. A switching means, triggered by a dosimeter, provides the method of switching from the conventional array to the second array when cumulative radiation dictates, thereby approximately doubling the period of time that the satellite's sensor system will remain operational.

It is a feature that the switching from the original photovoltaic array to the novel array is accomplished by a switching device which is coupled to a dosimeter that has a precalibrated gate voltage in relation to the total dose of radiation received.

DETAILED DESCRIPTION OF THE INVENTION

Figure 1:
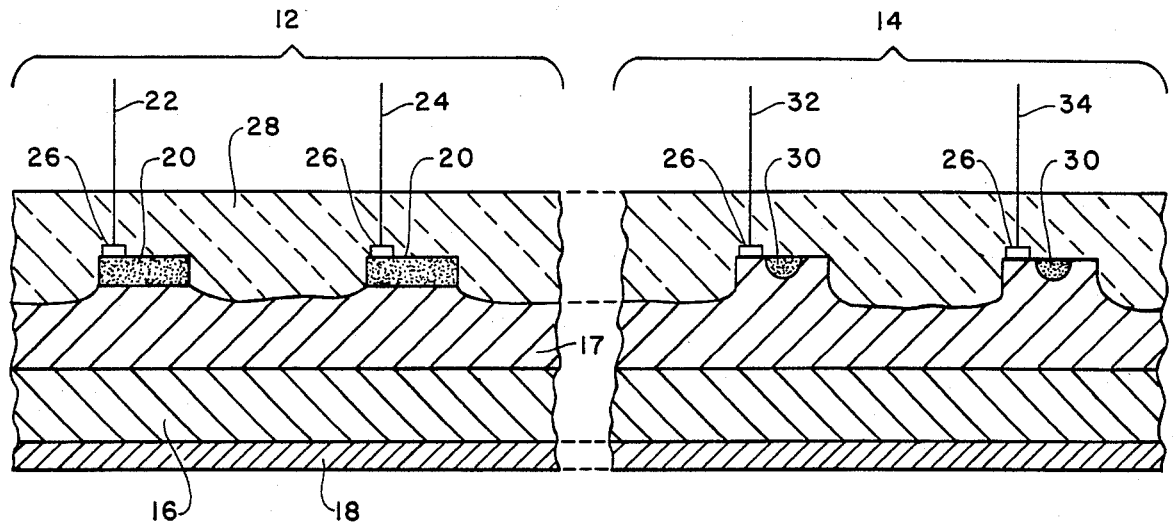
FIG. 1 is a cross-sectional view of a conventional array and a novel array of mercury cadmium telluride photovoltaic detectors.

Referring to FIG. 1 (not to scale), a cross-sectional view of a conventional array 12 of an IR detector-sensor is shown along with a novel array 14 of improved sensors.

The conventional array 12 consists of a substrate 16 composed of cadmium telluride (CdTe) which has an upper liquid phase epitaxial (LPE) layer 17 of p-type mercury cadmium telluride (HgCdTe) grown on it and a metallization layer 18 attached to a lower surface. The metallization layer serves as one electrode for the semiconductor device and is typically made of aluminum with an indium coating. On the upper surface of the epitaxial are a plurality of mesas 20, laterally spaced from each other, composed of n-type mercury cadmium telluride and affixed to form a p-n semiconductor junction with the p-type HgCdTe. Each mesa has an electrical connection 22, 24, via a metallization interface box 26 located on the top of each mesa. Typically, the metallization box is made of aluminum and placed to the side of the mesa so as to obstruct as little surface area as possible. Each electrical connection is separately monitored for signal voltage. A passivation layer 28 is attached to the upper surface of the epitaxial and the mesas to provide isolation from the environment. Operationally, infrared energy and natural radiation initially strike the passivation layer and are transitioned to the p-n semiconductor junction.

The novel array 14 of improved sensors is similar in nature to the conventional array, in that the substrate, epitaxial, metallization layer and passivation layer are constructed identically to the conventional array. As shown in FIG. 1, both arrays are located on the same substrate to afford a more comprehensive surveillance of the field of view. (They could also be located on different substrates.) This novel array, however, is incapable of performing as a sensor system initially as each detector has a much smaller p-n junction area. This is accomplished by forming the mesa from the epitaxial material 17 except for a portion of the surface. A small amount of n-type HgCdTe 30 is placed on each of the mesas such that it is a small volume compared with the mesa. Each mesa has a metallization interface box 26 for connecting individual electrical conductors 32 and 34 to the mesas and each electrical connection is independently monitored for signal voltage. It has been discovered that type conversion occurs on the surface of HgCdTe p-n junction infrared sensors when exposed to a significant amount of radiation. (Traditionally, an area of semiconductor material with more electrons than holes is called n-type, whereas an area with more holes than electrons is called p-type. Type conversion refers to the phenomen which occurs in a radiation environment when the ionizing radiation upsets the electron/hole ratio thereby converting p-type material to n-type or vice versa. For more information on type conversion, see "Mechanisms of Radiation Effects in Electronic Materials", Vol. 1, by V. A. J. van Lint, et al, 1980.) With increased radiation dose, the effective area of each junction is increased in direct proportion to the total dose. This effect increases the amount of n-type HgCdTe in each mesa to approximate the initial junction area of the conventional array. At this point, operational performance is possible.

Figure 2:
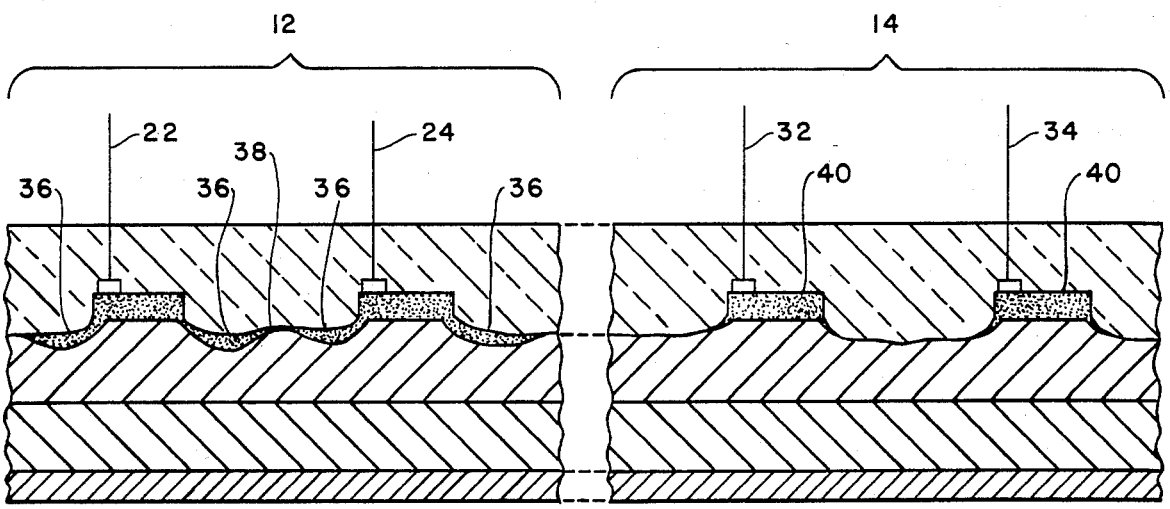
FIG. 2 is a cross-sectional view of a conventional array and a novel array of mercury cadmium telluride photovoltaic detectors after exposure to a significant amount of radiation.

FIG. 2 (not to scale) shows a cross-sectional view of the conventional array 12 and the novel array 14 of FIG. 1 after each array has been subjected to a substantial amount of radiation. With such a cumulative radiation dose, the effective surface area of each p-n junction is increased by type conversion. That is, the functional volume of n-type HgCdTe has spread from the mesas along the surface of p-type HgCdTe 36. When the spread from one mesa comes into contact 38 with the spread from an adjacent mesa, cross talk can occur between adjacent detectors. As each detector is designed to function independently, this contact between adjacent sensors results in a neighboring sensor producing a signal when only the primary sensor has been illuminated. Such cross talk degrades the performance of the conventional array. However, because the novel array has been designed with a much smaller junction area for each detector, the radiation environment increases the effective area of each detector junction 40 to approximate the initial junction area of the conventional array. It is at this point that the previously inoperable novel array is capable of being used since its effective junction areas have been increased by radiation activated type conversion. The ratio of the junction areas will then dictate the total dose at which the novel array becomes the primary sensor.

It should be noted that variations in constructing both the novel and conventional arrays are possible. For instance, the metallization layer could be located on the upper surface of the mesas with the direction of incoming radiation such that it would strike the substrate layer first rather than the p-n junction. A thin film of an anti-reflection coating applied to the external layer where radiation enters would also be very useful. Also, additional layers of other materials may be desirable, depending upon the application and construction selected. For example, a layer of zinc sulfide attached to the lower surface of the cadmium telluride layer could be used for isolating purposes and would not be uncommon.

Figure 3:
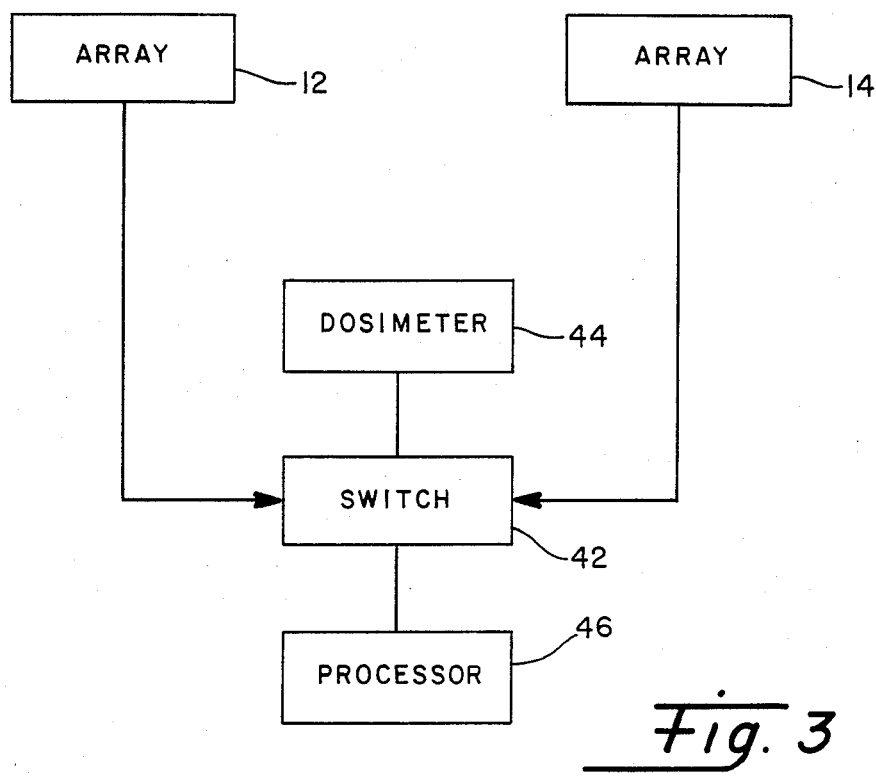
FIG. 3 is a simplified block diagram of the preferred embodiment of the invention.

FIG. 3 shows a simplified block diagram of an automatic switching device for switching from the conventional array to the novel array when the cumulative radiation dose warrants. The conventional array 12 and the novel array 14 are wired in parallel with the outputs of each array feeding into an electronic switching device 42, typically a Schmitt trigger or similar device. This Schmitt trigger is activated by a gate voltage from a conventional dosimeter 44 to select either the output signals from the conventional array or, alternately, the output signals from the novel or radiation activated array. The selected output signals are then fed to a signal processor 46 where they are examined to derive relevant data.

The dosimeter 44 is a precalibrated clean oxide PMOS dosimeter that can be interrogated for a preset threshold level. The dosimeter has a precalibrated gate voltage in relation to the cumulative radiation dose. The dosimeter continually outputs this gate voltage, although this voltage changes gradually in response to the total radiation absorbed. When the total dose of radiation that the sensor system is exposed to reaches a predetermined amount, the dosimeter's output gate voltage reaches the predetermined gate voltage that will activate the Schmitt trigger and the conventional array is turned off, and the radiation activated array is turned on.

Prior to initialization and operation of the system, a sample of the conventional array must be tested in various radiation environments in the laboratory to determine the measured radiation level that results in cross talk. The level which creates cross talk is the level at which the dosimeter must be preset to output the activation signal to the Schmitt trigger. For example, if laboratory cross talk occurred at $1 \times 10^5$ rad (HgCdTe), the automatic switching device would be set to be activated at a level slightly less than $1 \times 10^5$ rad (HgCdTe).

Figure 4:
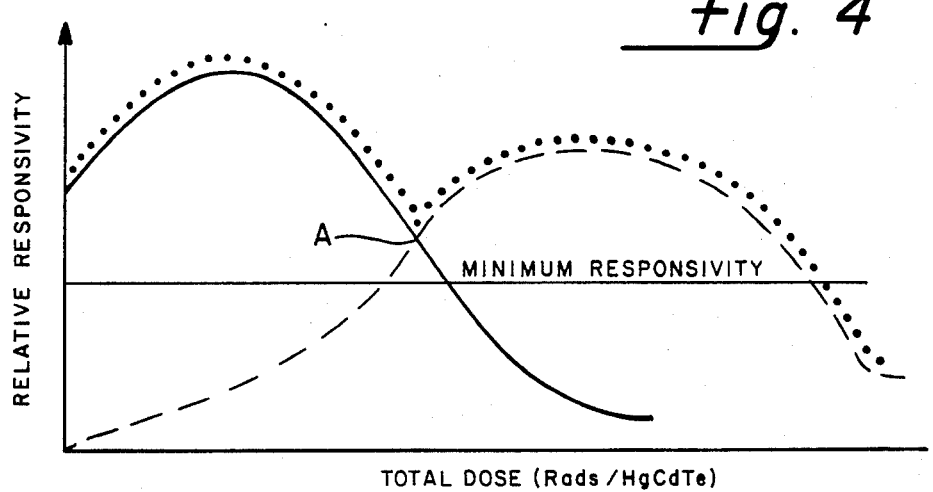
FIG. 4 is a graph of the relative responsivity of typical p-n junctions for the conventional and the novel arrays.

FIG. 4 illustrates the predicted behavior of the relative responsivity of typical p-n junctions in both arrays as a function of the total radiation dose received. The solid line indicates the relative response of the conventional array; namely, a high initial response followed by degraded performance to a point below minimum responsivity as cross talk increases. The dashed line indicates the relative response of the novel array; namely, a slow, gradual growth from below minimum responsivity to a point well above minimum responsivity that corresponds to the growth of the p-n junction and a corresponding increase in performance. Then, as the total dose begins to cause cross talk, the relative responsivity decreases. The dotted line indicates the responsivity of the preferred embodiment of the invention; the invention relies solely on the responsivity of the conventional array until the responsivity of the novel array exceeds that of the conventional array. Then, the invention relies solely on the responsivity of the novel array. Point A on the FIG. 3, where the solid line intersects with the dashed line, indicates that point where performance shifts from the conventional to the novel array. It is at this point that the dosimeter senses the total radiation dose and triggers the automatic switching device to switch to the novel array.

Thus, while preferred constructional features are embodied in the structure illustrated herein, it is to be understood that changes and variations may be made by the skilled in the art without departing from the spirit and scope of the invention.

We claim:

1. A sensor system comprising:
   first and second arrays of sensor devices on at least one semiconductor substrate including a photovoltaic material of a first conductivity type;
   said sensor devices formed of tri-metal photovoltaic material of a second conductivity type dispersed on said substrate in spaced apart relationship, and forming a plurality of p-n junctions;

said p-n junctions of said sensor devices of said second array having substantially smaller junction area than said junctions of said sensor devices of said first array;

whereby said first array of sensor devices becomes incapable of normal operation before said second array of sensor devices after exposure to a significant amount of radiation; and an electronic switching means coupled to said first and second arrays and operative to select said second array as an alternative to said first array as a resultant output in response to a cumulative radiation dose.

2. The sensor system according to claim 1, wherein said tri-metal photovoltaic material comprises mercury cadmium telluride (HgCdTe), and said substrate comprises cadmium telluride (CdTe) which has an upper liquid phase epitaxial layer of mercury cadmium telluride (HgCdTe) of said first conductivity type.

3. The sensor system according to claim 1 or 2, wherein said first conductivity type material is p-type material and said second conductivity type material is n-type material and further including an individual electrical connection to the tri-metal photovoltaic n-type material of each sensor device in each array.

4. The sensor system according to claim 3, wherein said sensor devices are in the shape of mesas protruding above said substrate, and said junction area of said sensor devices expands when exposed to a significant amount of radiation whereby the junctions spread beyond said mesas and come into contact with neighboring mesas, thereby resulting in cross talk between adjacent sensor devices.

5. The sensor system according to claim 4, wherein said junction area of said sensor devices of said second array spread to approximately the initial size of said junction area of said sensor devices of said first array in response to a predetermined amount of cumulative radiation exposure.

6. The sensor system according to claim 5, wherein said electronic switching means further includes a dosimeter for measuring cumulative radiation dosage that said sensor system has been exposed to and also includes a predetermined radiation dose level that will activate said electronic switching means.

7. The sensor system according to claim 6, further including a signal processor coupled to said electronic switching means for receiving and analyzing said resultant signals.

8. The sensor system according to claim 7, further including a passivation layer covering said sensor devices and said substrate on said first and second arrays in order to provide protection from the ambient environment and further including a metallization layer affixed to a lower surface of said substrate on said first and second arrays for functioning as an electrode.

* * * * *